(12) United States Patent
Yamashita et al.

(10) Patent No.: US 9,977,090 B2
(45) Date of Patent: May 22, 2018

(54) INSULATION FAILURE INSPECTING APPARATUS, INSULATION FAILURE INSPECTING METHOD USING SAME, AND METHOD FOR MANUFACTURING ELECTROCHEMICAL CELL

(71) Applicants: Takanori Yamashita, Tokyo (JP); Hirohisa Akita, Tokyo (JP); Noboru Akiyama, Tokyo (JP); Masataka Okushita, Tokyo (JP)

(72) Inventors: Takanori Yamashita, Tokyo (JP); Hirohisa Akita, Tokyo (JP); Noboru Akiyama, Tokyo (JP); Masataka Okushita, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 263 days.

(21) Appl. No.: 14/726,898

(22) Filed: Jun. 1, 2015

(65) Prior Publication Data

US 2015/0260797 A1     Sep. 17, 2015

Related U.S. Application Data

(62) Division of application No. 13/498,953, filed as application No. PCT/JP2010/066918 on Sep. 29, 2010, now Pat. No. 9,076,601.

(30) Foreign Application Priority Data

Sep. 30, 2009 (JP) .................. 2009-228790

(51) Int. Cl.
G01R 31/28 (2006.01)
G01R 31/36 (2006.01)
(Continued)

(52) U.S. Cl.
CPC ......... G01R 31/3641 (2013.01); G01R 31/12 (2013.01); H01G 11/06 (2013.01);
(Continued)

(58) Field of Classification Search
CPC ........ H01G 11/06; H01G 11/14; H01G 11/80; H01M 10/04; H01M 10/0525; H01M 10/48; G01R 31/12; G01R 31/3641
See application file for complete search history.

(56) References Cited

U.S. PATENT DOCUMENTS 4,829,256 A    5/1989 Yamagiwa et al.
6,671,165 B1   12/2003 Nakazawa et al.
(Continued)

FOREIGN PATENT DOCUMENTS

CN    87104748 A    2/1988
CN    1858598 A    11/2006
(Continued)

OTHER PUBLICATIONS

International Search Report dated Dec. 28, 2010, corresponding with International Application No. PCT/JP2010/066918.

*Primary Examiner* — Paul D Kim
(74) *Attorney, Agent, or Firm* — Fitch, Even, Tabin & Flannery LLP

(57) ABSTRACT

Disclosed is a method for manufacturing an electrochemical cell, wherein an insulation failure product can be accurately rejected, and an electrochemical cell can be used again after the insulation failure inspection. In the method for manufacturing the electrochemical cell (1), which is configured by hermetically housing an electrochemical cell main body (20) such that the leading end of a metal terminal (21) protrudes to the outside of the outer housing (10), an impulse voltage is applied between the metal terminal (21) and a metal foil layer (12), the waveform of the voltage applied to the
(Continued)

capacitance between the metal terminal (21) and the metal foil layer (12) is measured, and the insulation failure inspection step is performed.

5 Claims, 9 Drawing Sheets

(51) Int. Cl.
*H01G 11/06* (2013.01)
*H01G 11/14* (2013.01)
*H01G 11/80* (2013.01)
*H01M 10/48* (2006.01)
*H01M 10/04* (2006.01)
*G01R 31/12* (2006.01)
*H01M 10/0525* (2010.01)

(52) U.S. Cl.
CPC ............ *H01G 11/14* (2013.01); *H01G 11/80* (2013.01); *H01M 10/04* (2013.01); *H01M 10/48* (2013.01); *H01M 10/0525* (2013.01); *Y02E 60/13* (2013.01); *Y10T 29/49004* (2015.01)

(56) References Cited

U.S. PATENT DOCUMENTS

| | | | |
|---|---|---|---|
| 7,688,076 | B2 | 3/2010 | Aihara et al. |
| 7,769,554 | B2* | 8/2010 | Kikuchi ............ G05B 23/0264 324/500 |
| 2001/0021097 | A1 | 9/2001 | Ohya et al. |
| 2005/0242820 | A1 | 11/2005 | Kume et al. |
| 2008/0258737 | A1 | 10/2008 | Aihara et al. |
| 2009/0155674 | A1 | 6/2009 | Ikeuchi et al. |

FOREIGN PATENT DOCUMENTS

| | | |
|---|---|---|
| CN | 101133337 A | 2/2008 |
| CN | 101465449 A | 6/2009 |
| EP | 1870721 A | 12/2007 |
| EP | 1981099 A2 | 10/2008 |
| JP | 2000-195565 A | 7/2000 |
| JP | 2002-324572 A | 11/2002 |
| JP | 2004-273216 A | 9/2004 |
| JP | 2005-019241 A | 1/2005 |
| JP | 2005-235624 A | 9/2005 |
| JP | 2005-251685 A | 9/2005 |
| JP | 2007-018963 A | 1/2007 |
| JP | 2007-257974 A | 10/2007 |
| JP | 2009-87750 A | 4/2009 |
| JP | 2010-80326 A | 4/2010 |
| WO | 2004/021498 A1 | 3/2004 |

* cited by examiner

US 9,977,090 B2

INSULATION FAILURE INSPECTING APPARATUS, INSULATION FAILURE INSPECTING METHOD USING SAME, AND METHOD FOR MANUFACTURING ELECTROCHEMICAL CELL

CROSS-REFERENCE TO RELATED APPLICATIONS

This application is a divisional application of U.S. application Ser. No. 13/498,953, filed Mar. 29, 2012, now U.S. Pat. No. 9,076,601, that is the U.S. National Phase of International Application PCT/JP2010/066918, filed Sep. 29, 2010, and claims the benefit of foreign priority from Japanese Patent Application 2009-228790, filed Sep. 30, 2009, and the entire disclosures of all of such prior applications are hereby incorporated herein by reference.

TECHNICAL FIELD

The present invention generally relates to an insulation failure inspecting apparatus, an insulation failure inspecting method using the same, and a method for manufacturing an electrochemical cell, and particularly relates to a method for manufacturing an electrochemical cell, which allows a defective product having an insulation failure to be rejected accurately and an electrochemical cell that has undergone an insulation failure inspection to be reused.

BACKGROUND ART

A lithium ion battery is referred to also as a lithium secondary battery, and examples thereof include a lithium ion battery that has a liquid-, gel-, or high polymer-type electrolyte and uses high polymers as positive electrode and negative electrode active materials. A lithium ion battery has a configuration including a positive electrode current collecting material, a positive electrode active material layer, an electrolyte layer, a negative electrode active material layer, a negative electrode current collecting material, and an outer packaging body that packages these materials and layers, and a multilayer film is used as a packaging material for forming the outer packaging body.

FIG. 10 is a perspective view of a conventional lithium ion battery, and FIG. 11 is a sectional view of the lithium ion battery taken on line A-A' in FIG. 10. As shown in FIGS. 10 and 11, a lithium ion battery 101 is configured by hermetically housing a lithium ion battery main body 120 in an outer packaging body 110 constituted at least of a base layer 111, a metal foil layer 112, and a heat-sealable resin layer 113.

The lithium ion battery main body 120 is constituted of a cell (electricity storage portion) including a positive electrode composed of a positive electrode active material and a positive electrode current collector, a negative electrode composed of a negative electrode active material and a negative electrode current collector, and an electrolyte filled between the positive electrode and the negative electrode (none of these is shown in the figures), and a metal terminal 121 that is connected to each of the positive electrode and the negative electrode in the cell and whose tip end protrudes to the outside of the outer packaging body 110.

In the manufacturing process of the lithium ion battery 101, however, there has been the following problem. That is, when the mutually opposed heat-sealable resin layers 113 of the outer packaging body 110 are overlaid on each other, and a peripheral edge portion thereof is heat-sealed so that the lithium ion battery main body 120 is hermetically housed therein, the heat-sealable resin layer 113 might be thinned, due to heat and pressure applied thereto at the time of the heat-sealing, to such an extent that a short circuit occurs between the metal terminal 121 and the metal foil layer 112. Furthermore, after the heat-sealing, if the outer packaging body 110 is bent, a crack might occur in the heat-sealable resin layer 113, through which the electrolyte filled in the outer packaging body 110 permeates from part of the heat-sealable resin layer 113 into the metal foil layer 112, leading to a short circuit, or, even if a short circuit has not yet occurred between the metal terminal 121 and the metal foil layer 112, a minute crack might occur in the heat-sealable resin layer 113, which will possibly lead to a short circuit in the future.

Conventionally, as a solution to this problem, from among completed lithium ion batteries, samples for inspection are drawn at a predetermined frequency, with respect to each of which a predetermined high voltage is applied between the metal terminal 121 and the metal foil layer 112, and among the samples of the lithium ion battery 101, those in which, as a result of the voltage application, an insulation breakdown has occurred in the heat-sealable resin layer 113 are all removed from the production line as defective products having cracks that might lead to a short circuit. This inspecting method, however, has been disadvantageous in that the inspection can be performed only with respect to lithium ion batteries drawn as samples, and in that, due to low accuracy of the inspection, such a minute crack that it would not lead to a short circuit can hardly be identified. This inspecting method has been disadvantageous also in that, as a result of applying a high voltage, it is highly likely that some samples of the lithium ion battery 101 that are in fact not defective products have newly suffered from an insulation breakdown and thus cannot be reused after the inspection.

Furthermore, Patent Document 1 describes a method in which plating is performed to deposit metal on a metal foil layer constituting an outer packaging body, and an insulation-deteriorated area is determined by checking, by visual observation or the like, whether or not a metal deposit is formed thereby. This inspection method described in Patent Document 1, however, requires that a lithium ion battery be soaked in a plating bath and thus has been disadvantageous in that a lithium ion battery that has undergone the inspection cannot be reused irrespective of a result of the inspection.

LIST OF CITATIONS

Patent Literature

Patent Document 1: JP-A-2007-257974

SUMMARY OF THE INVENTION

Technical Problem

In view of the above-described problem, it is an object of the present invention to provide an insulation failure inspecting apparatus, an insulation failure inspecting method using the same, and a method for manufacturing an electrochemical cell, which allow a defective product having an insulation failure to be rejected accurately, and, particularly, a method for manufacturing an electrochemical cell, which allows an electrochemical cell that has undergone an insulation failure inspection to be reused.

Solution to the Problem

In order to achieve the above-described object, the present invention provides a method for manufacturing an electrochemical cell in which an electrochemical cell main body including a positive electrode composed of a positive electrode active material and a positive electrode current collector, a negative electrode composed of a negative electrode active material and a negative electrode current collector, and an electrolyte filled between the positive electrode and the negative electrode is hermetically housed in an outer packaging body formed by sequentially laminating at least a metal foil layer and a heat-sealable resin layer so that a tip end of a metal terminal that is connected to each of the positive electrode and the negative electrode protrudes to an outside. The method includes an insulation failure inspecting step in which an impulse voltage is applied between the metal terminal and the metal foil layer, and a waveform of a voltage applied to a capacitance between the metal terminal and the metal foil layer is measured.

According to this configuration, utilizing the fact that there is a predetermined capacitance between the metal terminal and the metal foil layer, and if there is an insulation failure between the metal terminal and the metal foil layer, the capacitance between the metal terminal and the metal foil layer decreases considerably, an insulation failure between the metal terminal and the metal foil layer can be detected by applying a voltage between the metal terminal and the metal foil layer and by subsequently measuring a waveform of the voltage applied to the capacitance between the metal terminal and the metal foil layer. Furthermore, since a voltage is applied as an impulse voltage, it is not required that the voltage application between the metal terminal and the metal foil layer be performed for a long time, and thus a phenomenon can be prevented in which the heat-sealable resin layer partially melts, which leads to an insulation breakdown and thus to new occurrence of a short circuit. Furthermore, by measuring a voltage waveform, the occurrence of a crack that will possibly lead to a short circuit in the future can be detected based on a slight variation in the voltage waveform. Thus, the accuracy of an insulation failure inspection can be increased, and a breakdown of an electrochemical cell in the insulation failure inspecting step can be avoided.

Furthermore, according to the present invention, in the above-described method for manufacturing an electrochemical cell, the insulation failure inspecting step is performed after the metal terminal is held in a sandwiched manner by the outer packaging body and a holding portion where the metal terminal is held is heat-sealed and before the electrolyte is filled in the outer packaging body.

According to this configuration, even though, in the manufacturing process of an electrochemical cell, when the metal terminal is held in a sandwiched manner by the outer packaging body and a holding portion where the metal terminal is held is heat-sealed, the heat-sealable resin layer might be thinned, due to heat and pressure applied thereto by the heat-sealing, to such an extent that a short circuit occurs between the metal terminal and the metal foil layer, such a short circuit and a crack in the vicinity of the metal terminal can be detected by the above-described insulation failure inspecting step.

Furthermore, according to the present invention, in the above-described method for manufacturing an electrochemical cell, the insulation failure inspecting step is performed after the electrolyte is filled in the outer packaging body.

According to this configuration, a short circuit and a crack that might occur in a peripheral edge portion of the outer packaging body heat-sealed after the electrolyte is filled in the outer packaging body can be detected by the above-described insulation failure inspecting step.

Furthermore, according to the present invention, in the above-described method for manufacturing an electrochemical cell, the insulation failure inspecting step is performed by measuring a value of a hold voltage held by the capacitance between the metal terminal and the metal foil layer immediately after the voltage application is halted and a value of the hold voltage held by the capacitance between the metal terminal and the metal foil layer after a lapse of a predetermined time from the halt of the voltage application.

According to this configuration, immediately after the application of an impulse voltage, electric charge is charged up in the capacitance between the metal terminal and the metal foil layer, and a hold voltage held by this capacitance thus reaches a maximum value. If there is an insulation failure between the metal terminal and the metal foil layer, however, the voltage does not rise to a value in the vicinity of a desired maximum value. Furthermore, if there is no insulation failure, a voltage applied to the capacitance between the metal terminal and the metal foil layer decreases slowly, whereas if there is an insulation failure, electric charge cannot be held, and thus the voltage decreases abruptly. Thus, by measuring a value of a hold voltage immediately after voltage application is halted and a value of the hold voltage after a lapse of a predetermined time from immediately after the halt of the voltage application, an insulation failure can be detected accurately.

Furthermore, according to the present invention, in the above-described method for manufacturing an electrochemical cell, a voltage of 10 V or lower is used as a voltage to be applied between the metal terminal and the metal foil layer.

According to this configuration, even though the metal terminal connected to the electrochemical cell main body hermetically housed in the outer packaging body is insulated from the metal foil layer of the outer packaging body by the heat-sealable resin layer that is an innermost layer of the outer packaging body, and applying a high voltage between the metal terminal and the metal foil layer might cause the heat-sealable resin layer to melt to bring the electrolyte filled in the outer packaging body into conduction with the metal foil layer, leading to the occurrence of an insulation breakdown, by using a voltage of 10 V or lower as an impulse voltage to be applied in the insulation failure inspecting step, new occurrence of an insulation breakdown can be prevented.

Furthermore, according to the present invention, in the above-described method for manufacturing an electrochemical cell, in a heat-sealing step in which a peripheral edge portion of the outer packaging body is heat-sealed so that the mutually opposed heat-sealable resin layers are bonded to each other, a margin region not to be heat-sealed is left unsealed on an outer peripheral side relative to a heat-sealing region, and in the insulation failure inspecting step, an impulse voltage is applied between a portion of the metal foil layer lying in the margin region and the metal terminal.

According to this configuration, the margin region is formed on the outer peripheral side relative to the heat-sealing region, and a connection terminal is connected to a portion of the metal foil layer lying in the margin region, and thus even if a flaw is generated on the surface of the outer packaging body in an area lying in the margin region, such a flaw on the surface of the outer packaging body can be removed by cutting away the margin region after the insulation failure inspecting step.

Furthermore, the present invention also provides an insulation failure inspecting apparatus including: a voltage generation unit that applies an impulse voltage to a subject of measurement; and a voltage measurement unit that measures a variation with time of a voltage held by the subject of measurement.

According to this configuration, by measuring a variation in voltage held by a subject of measurement after the application of an impulse voltage to the subject of measurement, it can be detected accurately whether or not the subject of measurement has an insulation failure.

Furthermore, according to the present invention, in the insulation failure inspecting apparatus configured as above, the voltage generation unit applies a voltage of 10 V or lower.

According to this configuration, by using a voltage of 10 V or lower as an voltage to be applied, it is possible to prevent melting of the heat-sealable resin layer and thus to prevent an insulation failure from occurring in an electrochemical cell in an insulation failure inspecting step.

Furthermore, according to the present invention, in the insulation failure inspecting apparatus configured as above, a connection terminal that connects the insulation failure inspecting apparatus to a subject of measurement has a holding portion for holding the subject of measurement in a sandwiching manner, and the holding portion has a sharp-shaped portion that bites into the subject of measurement through a base layer formed on a surface of the subject of measurement.

According to this configuration, by holding, in a sandwiching manner, an outer packaging body having the base layer as its outermost layer with the holding portion, the sharp-shaped portion is made to bite into a metal foil layer through the base layer, and thus a voltage can be applied easily from the connection terminal to the metal foil layer.

Furthermore, the present invention also provides an insulation failure inspecting method using the insulation failure inspecting apparatus configured as above. In the insulation failure inspecting method, with respect to an electrochemical cell in which an electrochemical cell main body including a positive electrode composed of a positive electrode active material and a positive electrode current collector, a negative electrode composed of a negative electrode active material and a negative electrode current collector, and an electrolyte filled between the positive electrode and the negative electrode is hermetically housed in an outer packaging body formed by sequentially laminating at least a metal foil layer and a heat-sealable resin layer so that a tip end of a metal terminal that is connected to each of the positive electrode and the negative electrode protrudes to an outside, an impulse voltage is applied between the metal terminal and the metal foil layer, and a value of a hold voltage held by a capacitance between the metal terminal and the metal foil layer immediately after the voltage application is halted and a value of the hold voltage held by the capacitance between the metal terminal and the metal foil layer after a lapse of a predetermined time from the halt of the voltage application are measured.

According to this configuration, it is possible to provide an insulation failure inspecting method that allows an electrochemical cell as a subject of measurement that has undergone an inspection to be reused while preventing new occurrence of an insulation failure in the electrochemical cell, which is attributable to the application of an impulse voltage.

DESCRIPTION OF EMBODIMENTS

Figure 10:
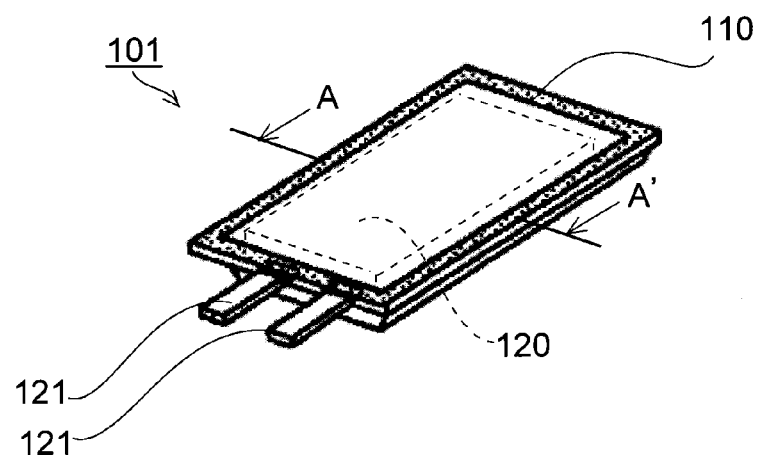
FIG. 10 is a perspective view of a conventional lithium ion battery.
Figure 11:
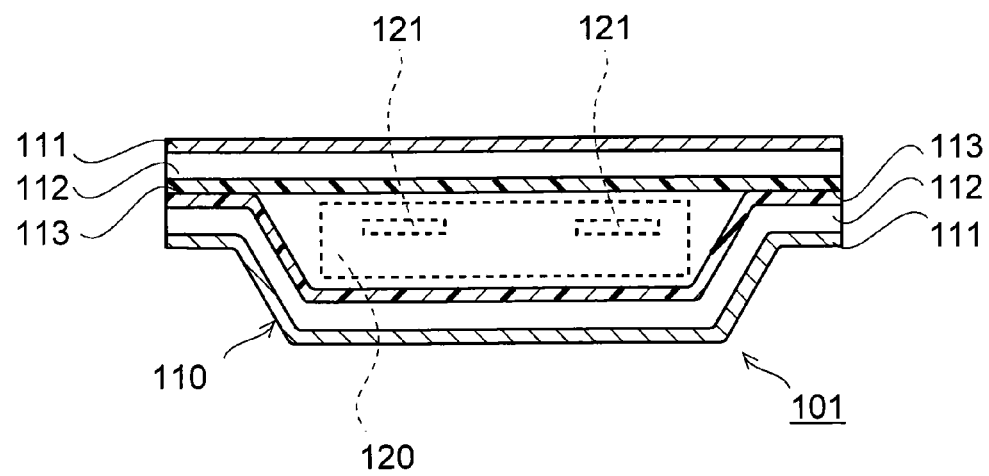
FIG. 11 is a sectional view of the lithium ion battery taken on line A-A' in FIG. 10.

The present invention provides a method for manufacturing an electrochemical cell, which allows a defective electrochemical cell having an insulation failure to be rejected and an electrochemical cell that has undergone an insulation failure inspection to be reused. With reference to the appended drawings and so on, the following describes in greater detail one embodiment of the method for manufacturing an electrochemical cell of the present invention. In the following, however, descriptions of components common to those in FIGS. 10 and 11 showing the conventional example are omitted.

Figure 1A:
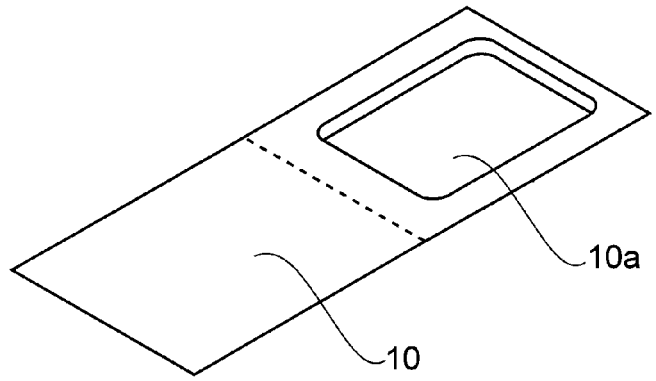
FIG. 1A is a plan view schematically showing a step of a manufacturing process of a lithium ion battery of the present invention.
Figure 1B:
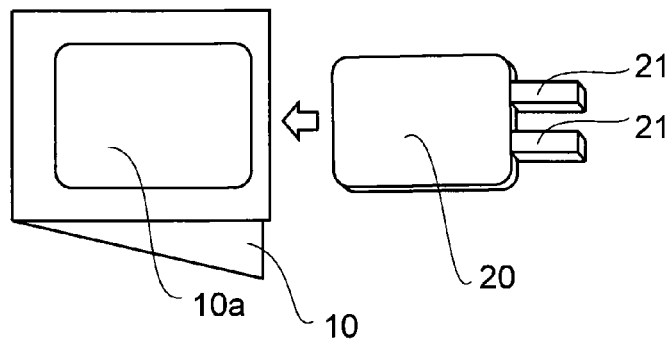
FIG. 1B is a plan view schematically showing a step of the manufacturing process of a lithium ion battery of the present invention.
Figure 1C:
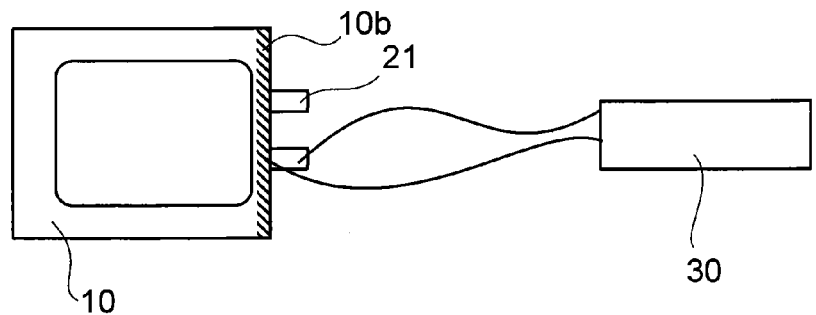
FIG. 1C is a plan view schematically showing a step of the manufacturing process of a lithium ion battery of the present invention.
Figure 1D:
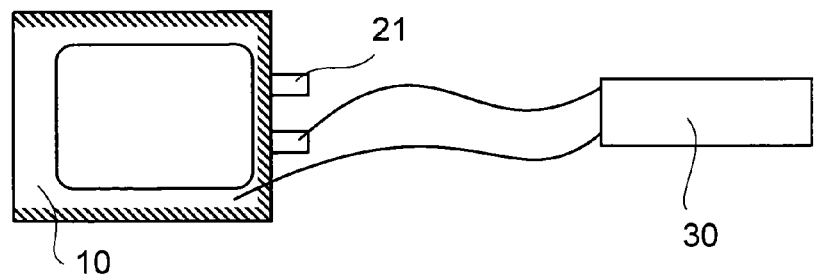
FIG. 1D is a plan view schematically showing a step of the manufacturing process of a lithium ion battery of the present invention.
Figure 2:
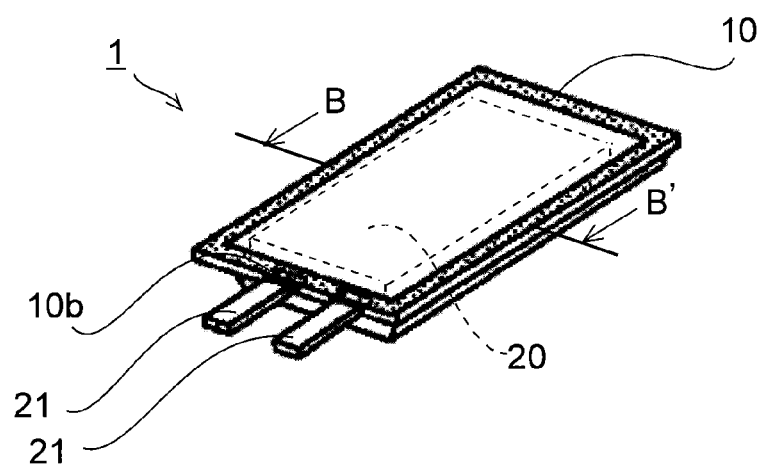
FIG. 2 is a perspective view of a lithium ion battery according to the present invention.
Figure 3:
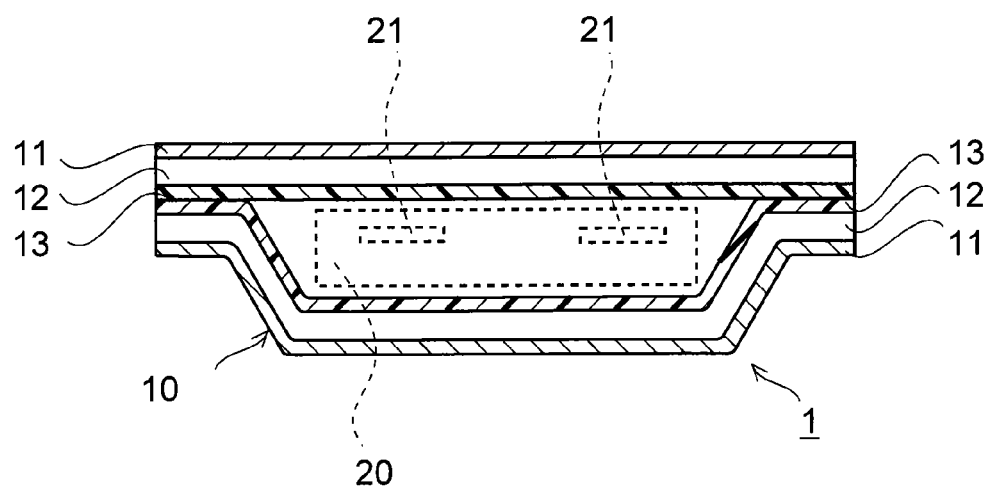
FIG. 3 is a sectional view of the lithium ion battery taken on line B-B' in FIG. 2.

FIGS. 1A to 1D are plan views schematically showing a manufacturing process of a lithium ion battery of this embodiment, FIG. 2 is a perspective view of a lithium ion battery, and FIG. 3 is a sectional view of the lithium ion battery taken on line B-B' in FIG. 2. A lithium ion battery 1 represents one example of the "electrochemical cell" of the present invention. In the manufacturing process of the lithium ion battery 1 of this embodiment, first, as shown in FIG. 1A, a packaging material cut out from a film is press-molded to form an outer packaging body 10 in which a housing space 10a for housing a lithium ion battery main body 20 is secured. Next, as shown in FIG. 1B, the outer packaging body 10 is folded in two and closed in that state, with the lithium ion battery main body 20 housed in the housing space 10a. At this time, as shown in FIG. 1C, a metal terminal 21 is held in a sandwiched manner by the folded outer packaging body 10 so that it protrudes to the outside, and a metal terminal holding portion 10b is heat-sealed. Then, by an insulation failure inspecting apparatus 30, an impulse voltage is applied between the metal terminal 21 (negative electrode) and a metal foil layer 12 constituting the outer packaging body 10 (a portion of the metal foil layer 12 lying over a region of the metal terminal holding portion 10b in which the metal terminal 21 is held in a sandwiched manner), and a waveform of the applied voltage is measured by the insulation failure inspecting apparatus 30, which is how a first insulation failure inspection in the metal terminal holding portion 10b is performed. Next, as shown in FIG. 1D, an electrolyte is filled in the outer packaging body 10, and all sides of the outer packaging body 10 in the folded state other than the metal terminal holding portion 10b are heat-sealed so that the lithium ion battery main body 20 is hermetically sealed in the outer packaging body 10, and thus the lithium ion battery 1 is completed. Then, lastly, by the insulation failure inspecting apparatus 30, an impulse voltage is applied between the metal terminal 21 (negative electrode) and the metal foil layer 12, and a waveform of the applied voltage is measured by the insulation failure inspecting apparatus 30, which is how a second insulation failure inspection is performed.

In this case, in the first insulation failure inspecting step, the electrolyte has not yet been filled between the metal terminal 21 and the metal foil layer 12, and a capacitance between the metal terminal 21 and the metal foil layer 12, therefore, is small. Based on this, it is preferable to use a high voltage as an impulse voltage to be applied in the first insulation failure inspecting step, and to be more specific, an insulation failure can be detected by applying a voltage of about 1000 V for 90 milliseconds. Since a voltage is applied as an impulse voltage, it is not required that the voltage application between the metal terminal 21 and the metal foil layer 12 be performed for a long time. This can prevent a phenomenon in which a heat-sealable resin layer 13 partially melts, which leads to an insulation breakdown and thus to new occurrence of a short circuit. Furthermore, in the second insulation failure inspecting step, the electrolyte has been filled between the metal terminal 21 and the metal foil layer 12, and a capacitance between the metal terminal 21 and the metal foil layer 12, therefore, is large. Based on this, it is possible to use a low voltage as an impulse voltage to be applied in the second insulation failure inspecting step, and to be more specific, an insulation failure can be detected by applying a voltage of about 10 V for 90 milliseconds. At this time, a waveform of the voltage applied to the capacitance between the metal terminal 21 and the metal foil layer 12 is measured, and thus an insulation failure can be detected based on a slight variation in the voltage waveform. This allows an insulation failure inspection to be performed by using a low impulse voltage and thus can avoid a breakdown of the electrochemical cell 1 in an insulation failure inspecting step.

Figure 4:
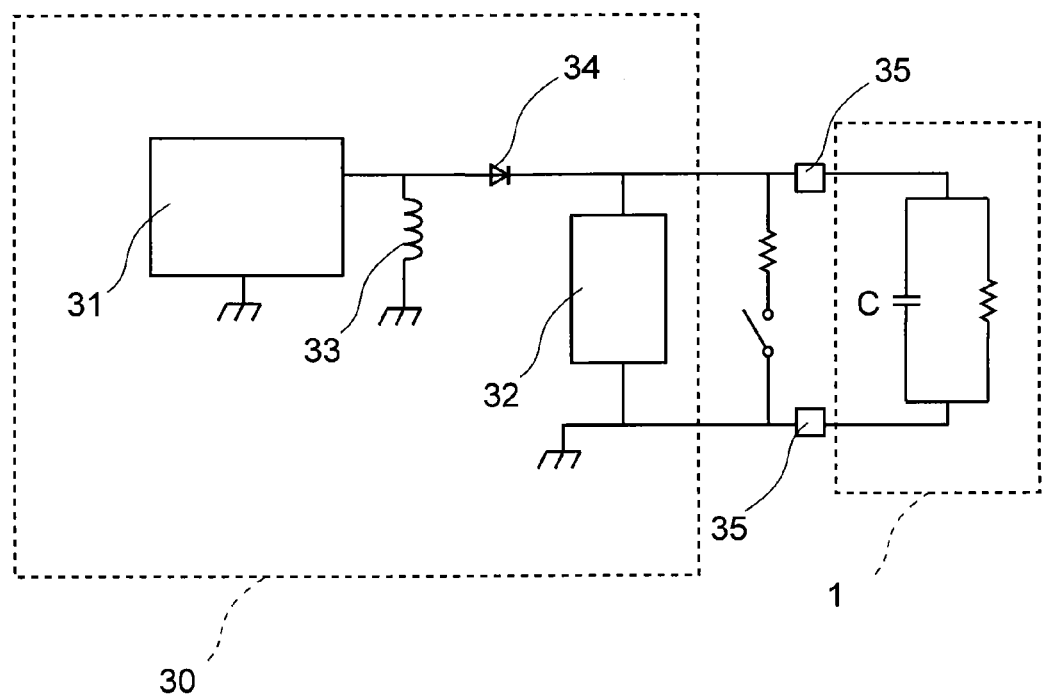
FIG. 4 is a diagram schematically showing a configuration of an insulation failure inspecting apparatus used in an insulation failure inspecting step of the present invention.
Figure 5:
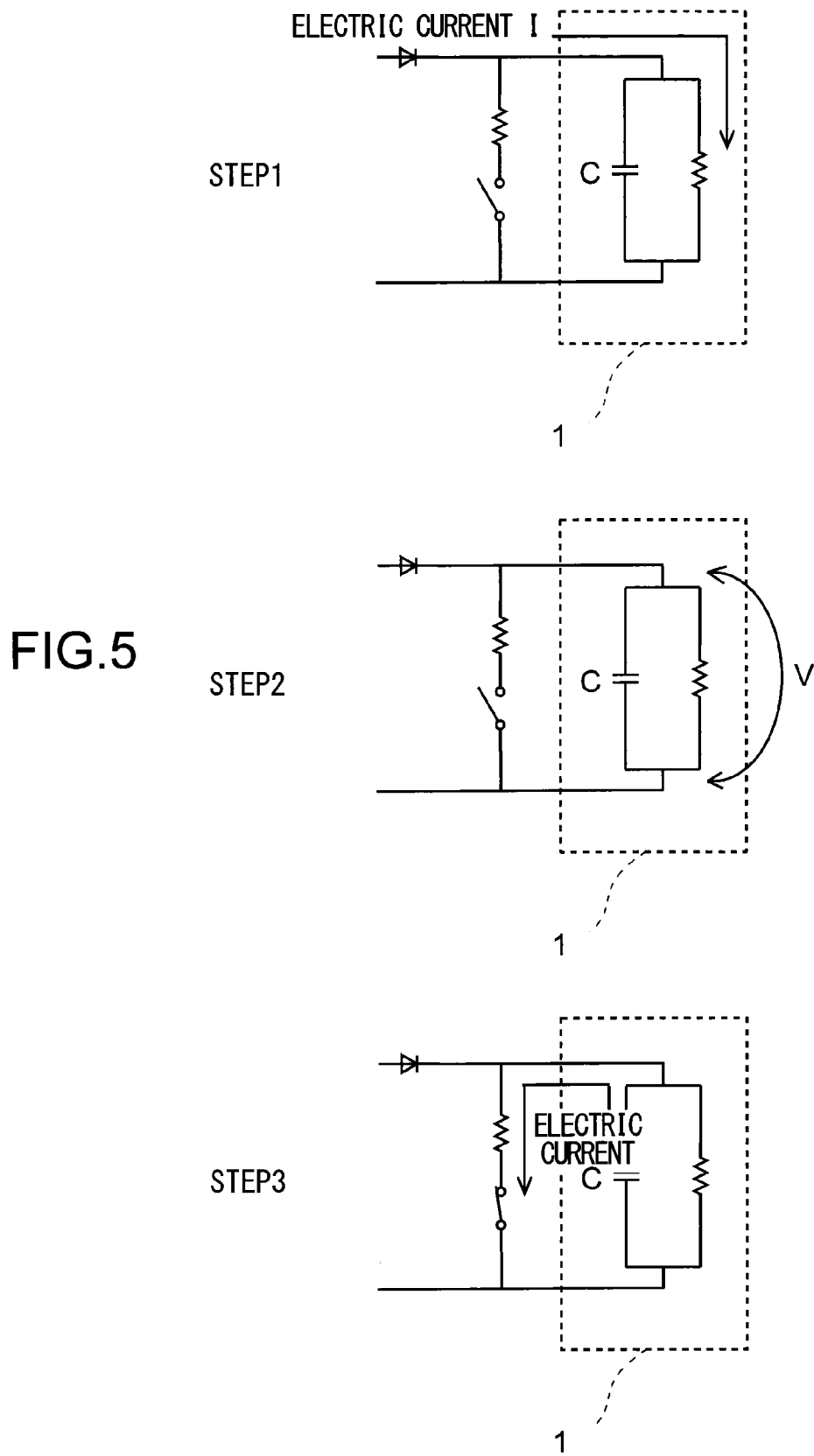
FIG. 5 is a diagram for explaining an operation of the insulation failure inspecting apparatus.
Figure 6:
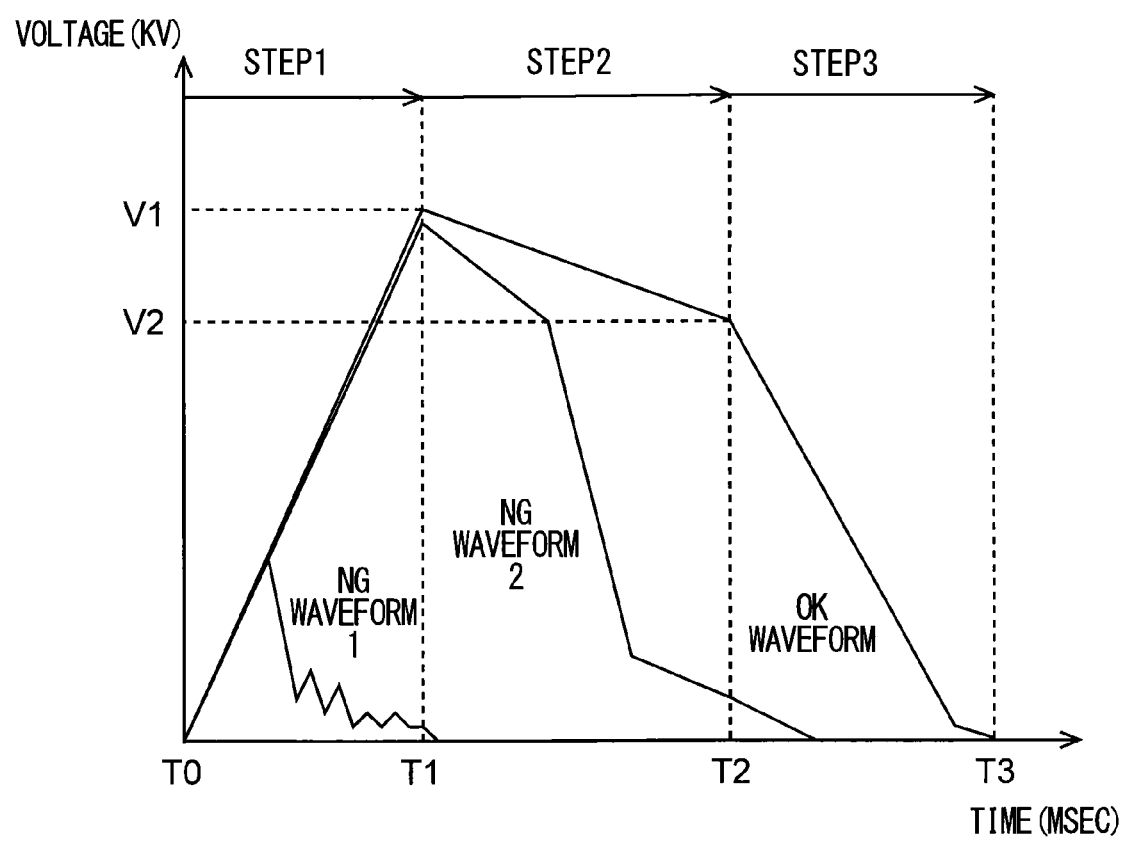
FIG. 6 is a diagram showing one example of voltage waveforms measured in the insulation failure inspecting step.

Next, the following describes in greater detail the first and second insulation failure inspecting steps. FIG. 4 is a diagram schematically showing a configuration of an insulation failure inspecting apparatus used in an insulation failure inspecting step, FIG. 5 is a diagram for explaining an operation of the insulation failure inspecting apparatus, and FIG. 6 is a diagram showing one example of voltage waveforms measured in the insulation failure inspecting step. The insulation failure inspecting apparatus 30 includes a voltage generation unit 31 and a voltage measurement unit 32 that can measure a waveform of a voltage applied to a capacitance of a subject of measurement. Furthermore, the lithium ion battery 1 as the subject of measurement has a capacitance C between the metal terminal 21 and the metal foil layer 12. By this configuration, at STEP 1 (T0 to T1), when an impulse voltage is applied between the metal terminal 21 and the metal foil layer 12 from the voltage generation unit 31, electric charge is charged in the capacitance C, so that a voltage rises in a predetermined waveform. This voltage waveform is observed in the voltage measurement unit 32. Subsequently, at STEP 2 (T1 to T2), after the voltage application is halted, the voltage charged in the capacitance C drops gradually, and at STEP 3 (T2 to T3), is completely discharged via a resistance R. Assuming that a waveform obtained in this case is referred to as an OK waveform, compared therewith, in a case where a short circuit has occurred between the metal terminal 21 and the metal foil layer 12, at STEP 1, a voltage drops abruptly without rising in a predetermined waveform (NG waveform 1). Furthermore, in a case where an insulation breakdown has occurred after the application of an impulse voltage, at STEP 2, a voltage drops abruptly (NG waveform 2).

As discussed above, in the insulation failure inspecting step of this embodiment, by using a capacitance provided between the metal terminal 21 and the metal foil layer 12, a variation in waveform of a voltage applied to the capacitance is observed, and thus not only a case where the lithium ion battery 1 has already suffered from a short circuit in the manufacturing process but also a case where the lithium ion battery 1 has a crack that will possibly lead to a short circuit in the future can be detected accurately.

Next, the following describes the insulation failure inspecting apparatus 30. The insulation failure inspecting apparatus 30 has the voltage generation unit 31 and the voltage measurement unit 32. In the voltage generation unit 31, an impulse voltage is applied between the metal terminal 21 and the metal foil layer 12 of the lithium ion battery 1 that is the subject of measurement via a connection terminal 35, and by the voltage measurement unit 32, a variation with time of a voltage held in a capacitance of the lithium ion battery 1 is measured. To be more specific, as shown in FIG. 4, the impulse voltage supplies a predetermined level of electric current to a coil 33, and then the supply is halted, so that a predetermined voltage is induced in the coil 33. This voltage acts as an impulse voltage, causing an electric current I to be applied between the metal terminal 21 and the metal foil layer 12 via a diode 34 and the connection terminal 35, and thus electric charge is charged up in the capacitance C of the lithium ion battery 1. At this time, in a case where the lithium ion battery 1 is in a normal state without an insulation failure, the maximum value of a hold voltage being charged up attains a given value (see the OK waveform shown in FIG. 6), whereas in a case where the lithium ion battery 1 has an insulation failure, the hold voltage being charged up does not rise to a desired maximum value.

Furthermore, at timing T1 at which the hold voltage charged up in the lithium ion battery 1 in the normal state reaches a maximum value V1, the voltage measurement unit 32 reads a value of the hold voltage of the lithium ion battery 1, and at timing T2 after a lapse of a predetermined time from the timing T1, it again reads a value of the hold voltage. In this case, however, if there is no insulation failure, the hold voltage held in the capacitance of the lithium ion battery 1 decreases slowly, whereas if there is an insulation failure, electric charge cannot be held, and thus the hold voltage decreases abruptly (see the NG waveform 2 shown in FIG. 6). As described above, the voltage measurement unit 32 reads hold voltages V1 and V2 of the lithium ion battery 1 at the timing T1 at which the hold voltage reaches a maximum value and at the timing T2 after the lapse of a predetermined time therefrom, and thus, based on the hold voltages V1 and V2 read at the timings T1 and T2, respectively, the lithium ion battery 1 can be evaluated for an insulation failure.

That is, in a case where the lithium ion battery 1 has an insulation failure, the voltage V1 at the timing T1 does not rise to a value in the vicinity of a desired maximum value, or the voltage V2 at the timing T2 drops significantly. The lithium ion battery 1 has an extremely small capacitance between the metal terminal 21 and the metal foil layer 12, and as shown in FIG. 3, the metal terminal 21 connected to the electrolyte and to the battery cell is insulated from the metal foil layer 12 only by the heat-sealable resin layer 13. As a material of the heat-sealable resin layer 13, for example, polypropylene is used favorably, and the heat-sealable resin layer 13 has a thickness of 10 µm to 100 µm. Hence, there is a possibility that applying a high voltage between the metal terminal 21 and the metal foil layer 12 easily causes the heat-sealable resin layer 13 to melt, leading to new occurrence of an insulation failure. Thus, it is preferable to use a voltage of 10 V or lower as a voltage to be applied. Also in a case where an acid-denatured polyolefin resin layer is interposed between the metal foil layer 12 and the heat-sealable resin layer 13, it is preferable to use a voltage of 10 V or lower as a voltage to be applied.

Figure 7A:
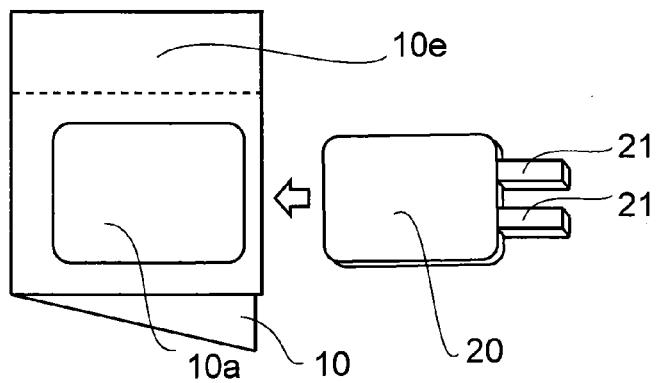
FIG. 7A is a plan view schematically showing a step of a manufacturing process of a lithium ion battery of the present invention.
Figure 7B:
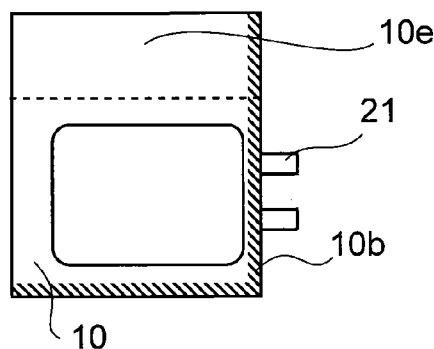
FIG. 7B is a plan view schematically showing a step of the manufacturing process of a lithium ion battery of the present invention.
Figure 7C:
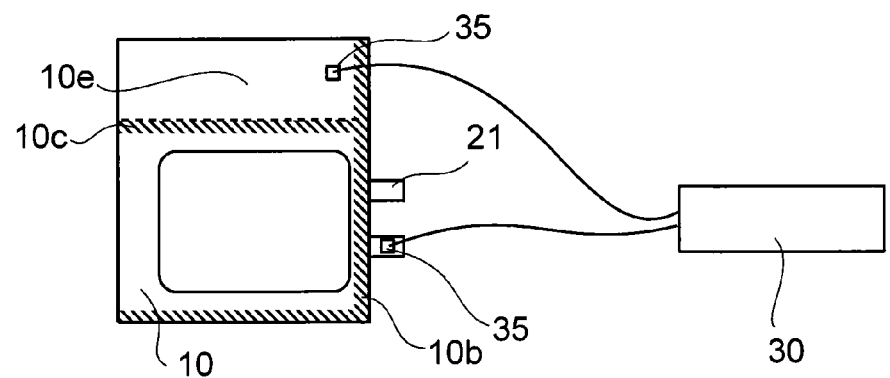
FIG. 7C is a plan view schematically showing a step of the manufacturing process of a lithium ion battery of the present invention.
Figure 7D:
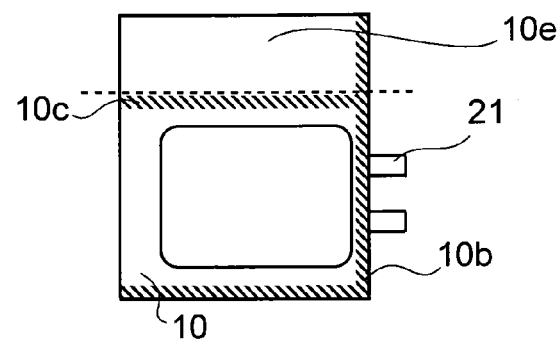
FIG. 7D is a plan view schematically showing a step of the manufacturing process of a lithium ion battery of the present invention.

Next, the following describes a modification example of the manufacturing process of a lithium ion battery of this embodiment. FIGS. 7A to 7D are plan views schematically showing a manufacturing process of a lithium ion battery according to this modification example. In the manufacturing process of the lithium ion battery 1 of this embodiment, first, as shown in FIG. 7A, a film is cut into an oversized piece that is then press-molded to form an outer packaging body 10 having a margin region 10e. The outer packaging body 10 thus obtained is folded in two, and the lithium ion battery main body 20 is housed in the housing space 10a. Then, as shown in FIG. 7B, two sides of the outer packaging body 10 in the folded state including the metal terminal holding portion 10b are heat-sealed, and an opening portion is provided on the side of the margin region 10e, after which the electrolyte is filled in the outer packaging body 10. Next, as shown in FIG. 7C, while the margin region 10e is left unsealed on the outer peripheral side, the opening portion of the outer packaging body 10 is heat-sealed to form the heat-sealing portion 10c so that the lithium ion battery main body 20 is hermetically sealed together with the electrolyte in the outer packaging body 10. Next, with one connection terminal 35 of the insulation failure inspecting apparatus 30 made to bite into a portion of the metal foil layer 12 lying in the margin region 10e and the other connection terminal 35 connected to the metal terminal 21 (negative electrode), an insulation failure inspection is performed, after which, as shown in FIG. 7D, the margin region 10e is separated by cutting away the outer peripheral side of the outer packaging body 10 relative to the heat-sealing portion 10c, and thus the lithium ion battery 1 is completed.

Figure 8:
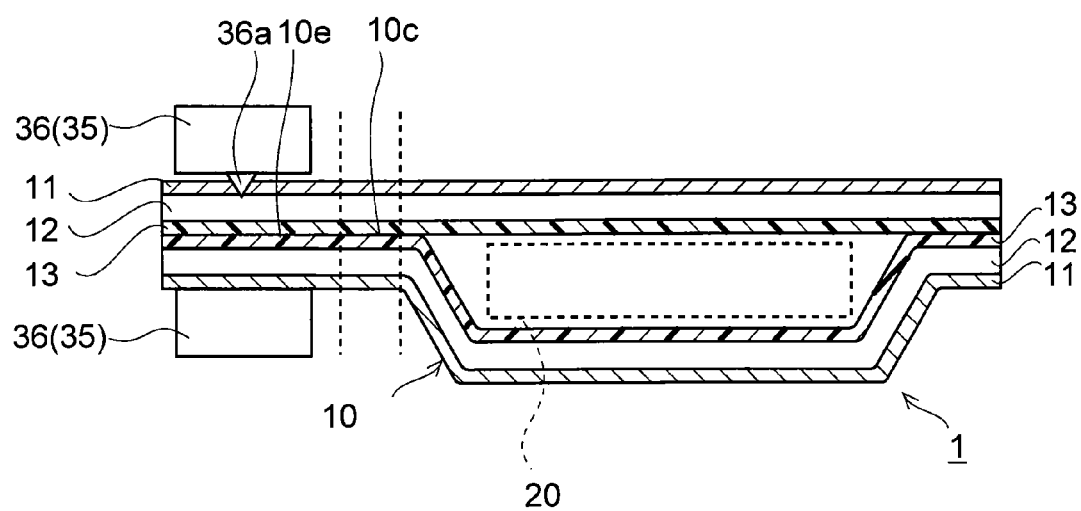
FIG. 8 is a sectional view of a lithium ion battery in an insulation failure inspecting step shown in FIG. 7C.

FIG. 8 is a sectional view of the lithium ion battery in the insulation failure inspecting step shown in FIG. 7C. As shown in FIG. 8, although the margin region 10e is formed on the outer peripheral side relative to the heat-sealing portion 10c, the portion of the metal foil layer 12 is in conduction with a portion of the metal foil layer 12 lying on the inner peripheral side relative to the heat-sealing portion 10c, and thus an impulse voltage applied from the one connection terminal 35 in the margin region 10e is charged in a capacitance between the portion of the metal foil layer 12 lying on the inner peripheral side relative to the heat-sealing portion 10c and the metal terminal 21. Furthermore, the connection terminal 35 has holding portions 36 for holding a subject of measurement in a sandwiching manner, and the holding portions 36 have a sharp-shaped portion 36a that bites into the subject of measurement through a base layer 11 formed on the surface of the subject of measurement. As described above, the connection terminal 35 holds the outer packaging body 10 in a sandwiching manner with the holding portions 36, with the sharp-shaped portion 36a made to bite into the metal foil layer 12, and thus connection between the connection terminal 35 and the metal foil layer 12 can be established easily. At this time, the base layer 11 is partially damaged by the sharp-shaped portion 36a, so that a flaw is generated on the surface of the outer packaging body 10. This damage to the base layer 11, however, does not remain in the lithium ion battery 1 as a completed product since the margin region 10e is removed after the inspection. The connection terminal 35 is not limited to the configuration in which two holding portions 36 are used to hold the outer packaging body 10 in a sandwiching manner and may have a configuration in which only the holding portion 36 having the sharp-shaped portion 36a is used and pressed against the outer packaging body 10 so that the sharp-shaped portion 36a is brought into conduction with the metal foil layer 12.

Figure 9:
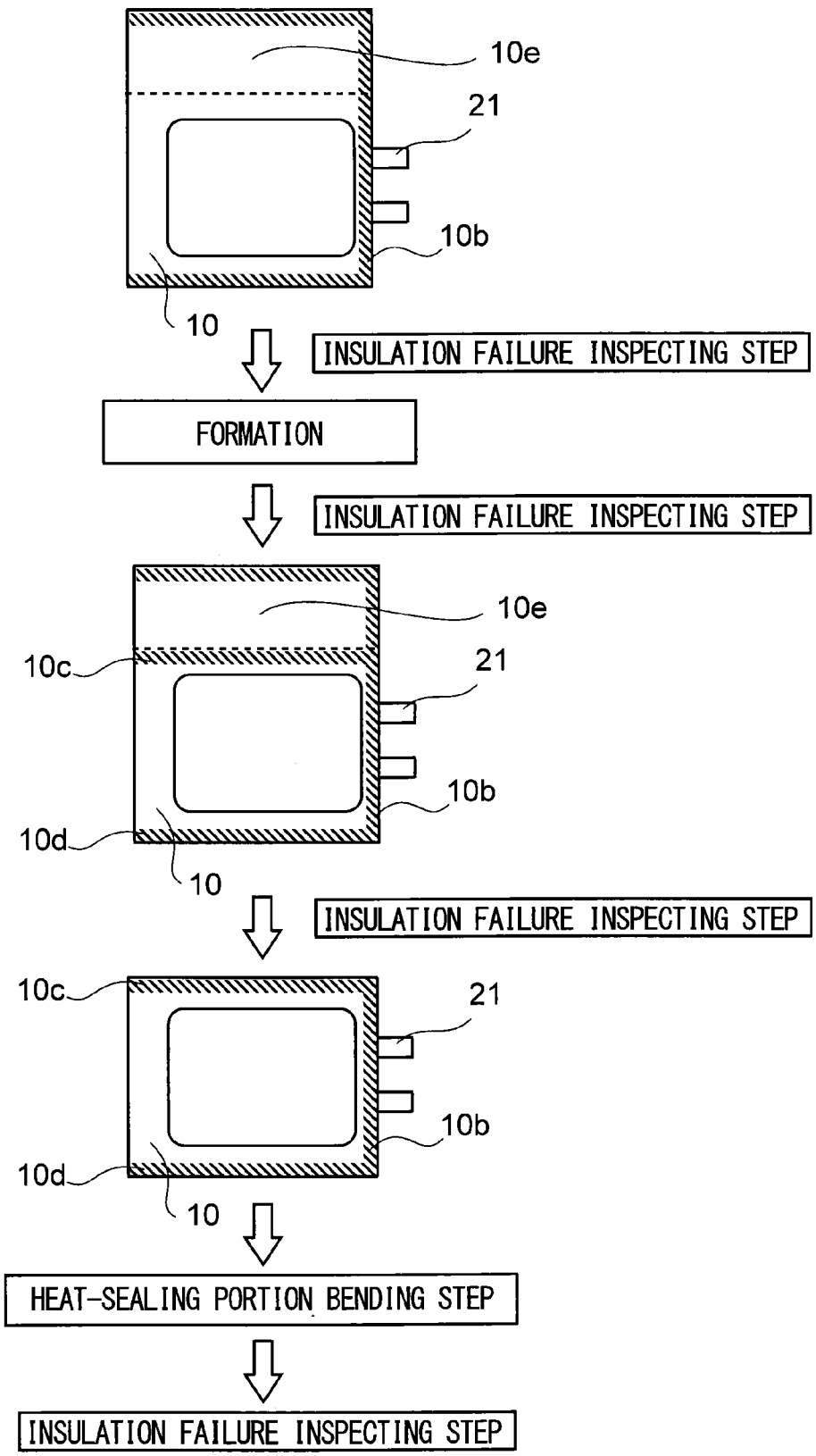
FIG. 9 is a plan view schematically showing a modification example of the manufacturing process of a lithium ion battery of the present invention.

Furthermore, the method for manufacturing a lithium ion battery is not limited to the above-described manufacturing processes, and the following process can also be adopted. That is, as shown in FIG. 9, first, the electrolyte is filled in the outer packaging body 10, after which an opening portion provided on the outer peripheral side relative to the margin region 10e is heat-sealed. Then, an insulation failure inspecting step is performed, followed by formation (conditions for the formation: 60° C., 5 hours), after which the insulation failure inspecting step is performed again. Next, the heat-sealing portion 10c on the inner peripheral side relative to the margin region 10e is heat-sealed, and the insulation failure inspecting step is performed, after which the margin region 10c is separated, and thus the lithium ion battery 1 is completed. Furthermore, the heat-sealing portions 10c and 10d of the completed lithium ion battery 1 might be bent at a time the lithium ion battery 1 is housed in a housing case, and, therefore, in view of a possibility of a crack occurring in the heat-sealable resin layer 13 due to such bending of the heat-sealing portions 10c and 10d, an insulation failure inspection may be performed as a final step after the step of bending the heat-sealing portions 10c and 10d. As discussed above, in each of the manufacturing processes of a lithium ion battery, the insulation failure inspecting step can be performed after each one of steps that might lead to the occurrence of an insulation failure, such as the heat-sealing steps or the step of bending the heat-sealing portions, is performed, and a manufacturing process of a lithium ion battery in which an insulation failure inspecting step is performed at least once falls within the technical field of the present invention. In the insulation failure inspecting step, it is preferable that, after the electrolyte is filled in the outer packaging body, an impulse voltage of 10 V or lower be applied between the metal terminal 21 and the metal foil layer 12, and it is preferable that, before the electrolyte is filled in the outer packaging body, an impulse voltage of 1000 V or lower be applied between the metal terminal 21 and the metal foil layer 12. Furthermore, it is preferable that, in the insulation failure inspecting step performed before the electrolyte is filled in the outer packaging body, one connection terminal 35 be connected to a portion of the metal foil layer 12 lying over a region in which the metal terminal 21 is held in a sandwiched manner.

EXAMPLE

Next, the following specifically describes the action and effects of the present invention by way of an example. This example is to make an evaluation regarding an insulation failure that newly occurs when an impulse voltage is applied to a lithium ion battery.
[Manufacturing of Outer Packaging Body]
On the upper surface of aluminum foil (thickness: 40 μm) on which a stretched nylon film (thickness: 25 μm) acting as a base layer is not laminated, acid-denatured polypropylene (thickness: 20 μm) was melt-extruded, and polypropylene (thickness: 15 μm) was laminated thereon, whereby an outer packaging body composed of the stretched nylon film, aluminum foil, acid-denatured polypropylene, and polypropylene was obtained Next, the above-described outer packaging body was cut into a sheet piece having a size of 60 mm (MD direction (machine direction)) by 60 mm (TD direction (transverse direction)), which was then folded in two in the MD direction, and opposed two sides of the folded sheet piece were heat-sealed so that a pouch-type outer packaging body having an opening at one side thereof was formed. Then, a lithium ion battery main body including a cell was sealed therein so that a metal terminal extended out to the outside from the open one side, after which an electrolyte was injected and the opening portion was hermetically sealed over a width of 3 mm while the metal terminal was held in a sandwiched manner, and thus a lithium ion battery was manufactured. In this case, heat-sealing was performed under conditions of a surface pressure of 2.0 MPa, a sealing temperature of 170° C., and a sealing time of 5.0 seconds.

Next, an insulation failure inspection was performed in which 100 samples of the above-described lithium ion battery were prepared, and a voltage of 10 V was applied as an impulse voltage between a negative electrode terminal and aluminum foil of each of the samples for 90 milliseconds. Similarly, for each of cases of using, as an impulse voltage, a voltage of 300 V and a voltage of 500 V, an insulation failure inspection was performed with respect to 100 lithium ion batteries as samples. After that, with respect to these 300 lithium ion batteries that have undergone the insulation failure inspections, once again, another insulation failure inspection was performed by applying a voltage of 10 V as an impulse voltage. In this manner, an evaluation was made regarding a frequency of the occurrence of an insulation failure in the insulation failure inspecting step that was performed first, and results of the evaluation are shown in Table 1.

TABLE 1

| Applied Voltage (V) | Evaluation |
|---|---|
| 10 V | Good |
| 300 V | Fair |
| 500 V | Poor |

As shown in Table 1, in the case of applying a voltage of 500 V, an insulation failure was detected in 10% of the samples as a whole (Poor), and in the case of applying a voltage of 300 V, an insulation failure was detected in 3% of the samples as a whole (Fair), whereas in the case of applying a voltage of 10 V, no insulation failure was detected (Good). These results confirm that, by using a voltage of about 10 V as an impulse voltage to be applied in an insulation failure inspection, new occurrence of an insulation breakdown in the failure inspecting step can be prevented.

The present invention is not limited to the foregoing embodiments and may be variously modified. Any embodiment obtained by appropriately combining the technical features disclosed in the different embodiments, respectively, is also encompassed within the technical scope of the present invention. For example, the method for manufacturing an electrochemical cell, the insulation failure inspecting method, and the insulation failure inspecting apparatus of each of the embodiments of the present invention may be applied to, in addition to a lithium ion battery, an electrochemical cell in which an electrochemical cell main body such as a capacitor or an electric double layer capacitor is housed in an outer packaging body.

LIST OF REFERENCE SYMBOLS 1 lithium ion battery
10 outer packaging body
10a housing space
10b metal terminal holding portion
11 base layer
12 metal foil layer
13 heat-sealable resin layer
20 lithium ion battery main body
21 metal terminal
30 insulation failure inspecting apparatus
31 voltage generation unit
32 voltage measurement unit
33 coil
34 diode
35 connection terminal
36 holding portion
36a sharp-shaped portion

The invention claimed is:
1. An insulation failure inspecting apparatus for inspecting whether or not there is an insulation failure in an electrochemical cell, wherein the electrochemical cell includes: an electrochemical cell main body including: a positive electrode that is composed of a positive electrode active material and a positive electrode current collector provided with a first metal terminal at an end portion thereof; a negative electrode that is composed of a negative electrode active material and a negative electrode current collector provided with a second metal terminal at an end portion thereof; and an electrolyte filled between the positive electrode and the negative electrode; and an outer packaging body made of a packaging material formed by sequentially laminating at least a metal foil layer and a heat-sealable resin layer, the insulation failure inspecting apparatus comprising:
a voltage generation unit operable to apply an impulse voltage—between the first metal terminal and the metal foil layer or between the second metal terminal and the metal foil layer; and
a voltage measurement unit operable to measure temporal change in a voltage held in the electrochemical cell after the impulse voltage stops being applied.

2. The insulation failure inspecting apparatus according to claim 1, wherein the impulse voltage applied by the voltage generation unit is 10 volts or less.

3. An insulation failure inspecting method for inspecting whether or not there is an insulation failure in an electrochemical cell, wherein the electrochemical cell includes: an electrochemical cell main body including: a positive electrode that is composed of a positive electrode active material and positive electrode current collector provided with a first metal terminal at an end portion thereof; a negative electrode that is composed of a negative electrode active material and a negative electrode current collector provided with a second metal terminal at an end portion thereof; an electrolyte filled between the positive electrode and the negative electrode; and an outer packaging body made of a packaging material formed by sequentially laminating at least a metal foil layer and a heat-sealable resin layer, using an insulation inspection apparatus comprising a voltage generation unit operable to apply an impulse voltage—between the first metal terminal and the metal foil layer or between the second metal terminal and the metal foil layer; and a voltage measurement unit operable to measure temporal change in a voltage held in the electrochemical cell after the impulse voltage stops being applied, the method comprising (a) applying an impulse voltage between the first metal terminal and the metal foil layer or between the second metal terminal and the metal foil layer, and (b) measuring temporal change in a voltage held in the electrochemical cell after the impulse voltage stops being applied.

4. A method according to claim 3, wherein the method further comprises in (a) applying first impulse voltage of about 1000 V for 90 milliseconds; followed by the measuring step (b); (c) repeating step (a) but applying a second impulse voltage of 10 V or less; and (d) repeating a measuring step (b) after step (c).

5. An insulation failure inspecting method for inspecting, using the inspection failure inspecting apparatus according to claim 2, whether or not there is an insulation failure in an electrochemical cell, wherein the electrochemical cell includes: an electrochemical cell main body including: a positive electrode that is composed of a positive electrode active material and positive electrode current collector provided with a first metal terminal at an end portion thereof; a negative electrode that is composed of a negative electrode active material and a negative electrode current collector provided with a second metal terminal at an end portion thereof; an electrolyte filled between the positive electrode and the negative electrode; and an outer packaging body made of a packaging material formed by sequentially laminating at least a metal foil layer and a heat-sealable resin layer, the method comprising applying an impulse voltage between the first metal terminal and the metal foil layer or between the second metal terminal and the metal foil layer, and measuring temporal change in a voltage held in the electrochemical cell after the impulse voltage stops being applied.

* * * * *